United States Patent
Prengler et al.

(10) Patent No.: US 10,069,454 B2
(45) Date of Patent: *Sep. 4, 2018

(54) SYSTEM AND METHOD FOR MANAGING DISTRIBUTED RENEWABLE ENERGY SYSTEMS AND SERVICE PROVIDERS

(71) Applicant: Solar Chief, LLC, Dallas, TX (US)

(72) Inventors: Randall William Prengler, Dallas, TX (US); Mark Myles Chazanow, Plano, TX (US); Michael R. Uhrick, Dallas, TX (US)

(73) Assignee: SOLAR CHIEF, LLC, Dallas, TX (US)

( * ) Notice: Subject to any disclaimer, the term of this patent is extended or adjusted under 35 U.S.C. 154(b) by 1426 days.

This patent is subject to a terminal disclaimer.

(21) Appl. No.: 13/847,437

(22) Filed: Mar. 19, 2013

(65) Prior Publication Data
US 2014/0288717 A1   Sep. 25, 2014

Related U.S. Application Data

(63) Continuation of application No. 12/914,546, filed on Oct. 28, 2010, now Pat. No. 8,401,711.

(51) Int. Cl.
*H02S 10/00* (2014.01)
*G06Q 50/06* (2012.01)

(52) U.S. Cl.
CPC ............. *H02S 10/00* (2013.01); *G06Q 50/06* (2013.01); *F24J 2200/04* (2013.01); *Y02B 10/70* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 5,706,434 A | 1/1998 | Kremen et al. | |
| 7,698,219 B2 | 4/2010 | Kremen et al. | |
| 7,890,436 B2 | 2/2011 | Kremen | |
| 8,019,697 B2 | 9/2011 | Ozog | |
| 8,103,465 B2 * | 1/2012 | Brzezowski | G01D 4/00 700/286 |
| 8,285,574 B2 * | 10/2012 | Boss | G06Q 10/06 705/7.11 |

(Continued)

*Primary Examiner* — Robert E Fennema
(74) *Attorney, Agent, or Firm* — Jackson Walker LLP; Christopher J. Rourk

(57) ABSTRACT

A method for managing distributed renewable energy systems comprising receiving first meter data for a plurality of first meters, each of the plurality of first meters associated with a renewable energy power generation component at an institution and measuring an amount of power generated by each associated renewable energy power generation component over a first period of time. Receiving second meter data for a plurality of second meters, each of the plurality of second meters associated with an institution having a renewable energy power generation component and measuring an amount of power consumed by each associated institution over a period of second time. Determining a difference between the amount of power measured by each of the first meters and the amount of power measured by a corresponding one of each of the second meters at each institution.

3 Claims, 3 Drawing Sheets

(56) References Cited

U.S. PATENT DOCUMENTS

| | | | |
|---|---|---|---|
| 2005/0165511 A1* | 7/2005 | Fairlie | F17D 1/04 700/286 |
| 2008/0177678 A1* | 7/2008 | Di Martini | G01D 4/002 705/412 |
| 2010/0179704 A1* | 7/2010 | Ozog | G06Q 10/06315 700/291 |
| 2010/0217550 A1* | 8/2010 | Crabtree | H02J 13/0079 702/62 |
| 2010/0222935 A1* | 9/2010 | Forbes, Jr. | G06Q 10/00 700/291 |
| 2011/0004358 A1* | 1/2011 | Pollack | B60L 11/1842 700/297 |
| 2011/0121647 A1* | 5/2011 | Ragavanis | H02J 1/06 307/19 |
| 2011/0172835 A1* | 7/2011 | Imes | G06Q 50/06 700/287 |
| 2011/0231028 A1* | 9/2011 | Ozog | G06Q 10/06 700/291 |
| 2011/0307109 A1* | 12/2011 | Sri-Jayantha | G06Q 10/04 700/291 |
| 2012/0046859 A1* | 2/2012 | Imes | G05D 23/1905 701/409 |
| 2012/0101639 A1* | 4/2012 | Carralero | G06F 1/26 700/286 |

* cited by examiner

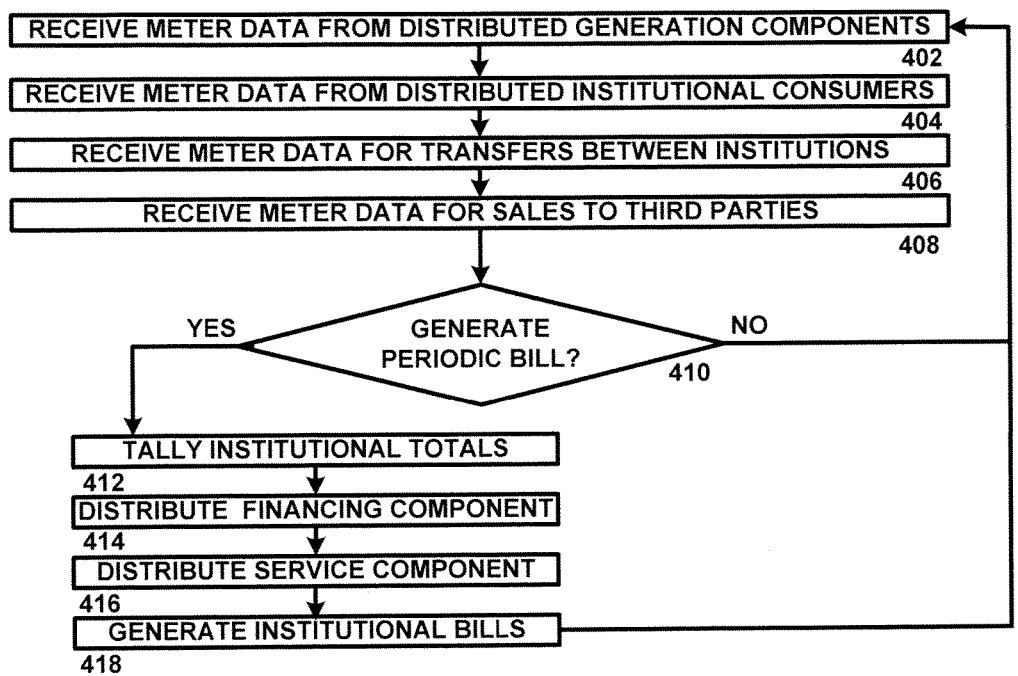

SYSTEM AND METHOD FOR MANAGING DISTRIBUTED RENEWABLE ENERGY SYSTEMS AND SERVICE PROVIDERS

CROSS-REFERENCE TO RELATED APPLICATION

The present application is a continuation of U.S. Ser. No. 12/914,546, filed Oct. 28, 2010, now U.S. Pat. No. 8,401,711, entitled "SYSTEM AND METHOD FOR MANAGING DISTRIBUTED RENEWABLE ENERGY SYSTEMS" which is hereby incorporated by reference for all purposes.

FIELD OF THE INVENTION

The invention relates to renewable energy systems, and more particularly to a system and method for managing distributed renewable energy systems that facilitates installation, maintenance, financing and operations of distributed renewable energy systems.

BACKGROUND OF THE INVENTION

Renewable energy systems are difficult to implement because they tend to be small and distributed. For example, a residential solar hot water system can generate enough savings to justify the cost of installing and maintaining the system, but the average homeowner may not have sufficient knowledge or confidence in the systems to install one. Likewise, residential solar photovoltaic systems can also generate enough savings to justify the cost of installing and maintaining the system, particularly when tax incentives and other programs can be used to reduce the cost of the system, but the average homeowner might not be familiar enough with the availability of tax incentives, and may also be risk averse to relatively new technology. Because of the inherent risks involved with system repairs and unknown costs for each individual system, renewable energy systems are not being adopted rapidly. Presently, customers who purchase renewable energy systems have a tremendous burden with regard to upfront cost, which are currently amortized for tax and other purposes over twenty years.

SUMMARY OF THE INVENTION

A method for managing distributed renewable energy systems comprising receiving first meter data for a plurality of first meters, each of the plurality of first meters associated with a renewable energy power generation component at an institution and measuring an amount of power generated by each associated renewable energy power generation component over a first period of time. Receiving second meter data for a plurality of second meters, each of the plurality of second meters associated with an institution having a renewable energy power generation component and measuring an amount of power consumed by each associated institution over a second period of time. Determining a difference between the amount of power measured by each of the first meters and the amount of power measured by a corresponding one of each of the second meters at each institution. Assessing a first charge to each of the institutions based on the corresponding difference determined for each institution. Assessing a second charge to each of the institutions based on a finance charge for the renewable energy power generation component associated with the institution.

DETAILED DESCRIPTION OF PREFERRED EMBODIMENTS

Figure 1:
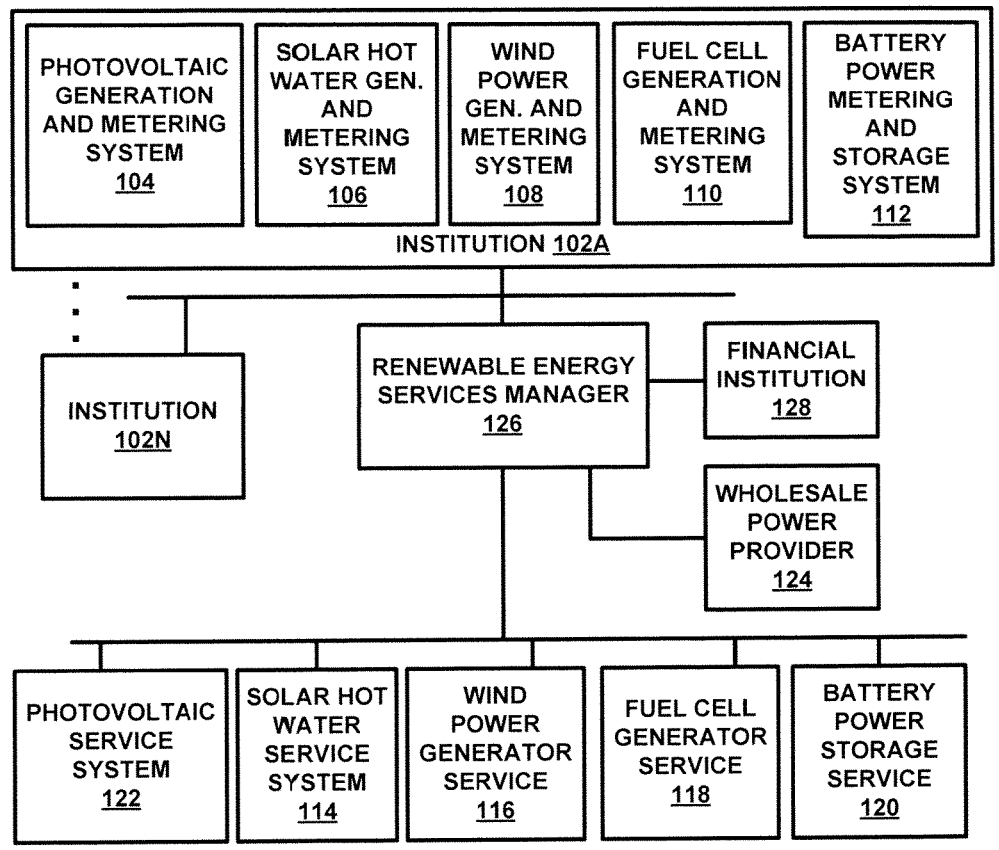
FIG. 1 is a diagram of a system for coordinating renewable energy services in accordance with an exemplary embodiment of the present invention.

In the description that follows, like parts are marked throughout the specification and drawings with the same reference numerals, respectively. The drawing figures might not be to scale and certain components can be shown in generalized or schematic form and identified by commercial designations in the interest of clarity and conciseness.

FIG. 1 is a diagram of a system 100 for coordinating renewable energy services in accordance with an exemplary embodiment of the present invention. System 100 allows institutions to acquire renewable energy resources and to pay for the renewable energy resources through a contractual arrangement with an energy services provider by adding a scheduled charge, such as a "renewable adder," to the institution's monthly electricity bill.

System 100 includes institutions 102A through 102N, which can utilize one or more of photovoltaic generation and metering system 104, solar hot water generation and metering system 106, wind power generation and metering system 108, fuel cell generation and metering system 110 and battery power metering and storage system 112, or other suitable renewable energy systems such as cogeneration systems. Photovoltaic generation and metering system 104, solar hot water generation and metering system 106, wind power generation and metering system 108, fuel cell generation and metering system 110 and battery power metering and storage system 112 can be coupled to one or more of an electric power grid and institution services system, such as an institution electric power service system or an institution hot water service system. As used herein, the term "coupled" and its cognate terms such as "couples" or "couple," can include a physical connection (such as a wire, optical fiber, or a telecommunications medium), a virtual connection (such as through randomly assigned memory locations of a data memory device or a hypertext transfer protocol (HTTP) link), a logical connection (such as through one or more semiconductor devices in an integrated circuit), or other suitable connections. In one exemplary embodiment, a communications medium can be a network or other suitable communications media.

Photovoltaic generation and metering system 104, solar hot water generation and metering system 106, wind power generation and metering system 108, fuel cell generation and metering system 110 and battery power metering and storage system 112 can generate metering data and provide the metering data to renewable energy services manager 126 or other suitable systems. In one exemplary embodiment, the metering data can include an amount of electric power that has been generated, stored or received over a period of time, either by an associated institution services system (such as a transmission and distribution services provider) or components of system 100. In this exemplary embodiment, an institution can consume all of the electric power, solar hot water or other renewable energy generated by an energy generation component, such that the metering data can be used to generate energy billing data. Likewise, an institution can provide some of the renewable energy generated by an energy generation component to the electric grid or other institutions, such as where electric power is sold back to the retail or wholesale electric power provider, where a cogeneration facility provides hot water to other institutions, or in other suitable embodiments. Electrical energy can also be stored, such as using battery power metering and storage system 112 or other suitable energy storage systems, and the associated metering system can generate metering data that identifies the amount of energy stored in the storage system as well as the amount of energy returned by the storage system and the energy that has been lost by the storage cycle. The metering systems associated with photovoltaic generation and metering system 104, solar hot water generation and metering system 106, wind power generation and metering system 108, fuel cell generation and metering system 110 and battery power metering and storage system 112 can also track power that is delivered to the electricity distribution grid, such as power that is sold back to the wholesale or retail electric power provider.

The plurality of institutions 102A through 102N are coupled to renewable energy services manager 126 over a network, such as an electric power transmission and distribution network, a suitable data communications media, or other suitable connections. In this manner, renewable energy services manager 126 can receive the metering data and can also act as an electric power retailer, where suitable. Renewable energy services manager 126 can be implemented in hardware or a suitable combination of hardware and software, and can be one or more software systems operating on a general purpose processor or server platform. As used herein and by way of example and not by limitation, "hardware" can include a combination of discrete components, an integrated circuit, an application-specific integrated circuit, a field programmable gate array, a general purpose processing or server platform, or other suitable hardware. As used herein and by way of example and not by limitation, "software" can include one or more objects, agents, threads, lines of code, subroutines, separate software applications, one or more lines of code or other suitable software structures operating in one or more software applications or on one or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Renewable energy services manager 126 is also electronically coupled to a plurality of maintenance service provider electronic data processing systems, such as photovoltaic service system 122, solar hot water service system 114, wind power generator service 116, fuel cell generator service 118, battery power storage service 120, and other suitable renewable energy maintenance service providers. The service providers can be the same entities that install the renewable energy systems at institutions 102A through 102N, or can be other suitable service providers.

Renewable energy services manager 126 can enter into contractual relationships with institutions 102A through 102N, service providers such as photovoltaic service system 122, solar hot water service system 114, wind power generator service 116, fuel cell generator service 118, battery power storage service 120, and other suitable service providers. Renewable energy services manager 126 can also coordinate financing for installation and maintenance costs for each of the different renewable energy systems through a financial institution 128, and can provide retail power by reselling power from wholesale power provider 124.

In operation, renewable energy services manager 126 enters into contractual agreements with institutions 102A through 102N to install and operate renewable energy systems such as photovoltaic generation and metering system 104, solar hot water generation and metering system 106, wind power generation and metering system 108, fuel cell generation and metering system 110, battery power metering and storage system 112 or other suitable renewable energy devices. In addition, renewable energy services manager 126 receives meter data that is used to track the amount of energy that is generated by the distributed renewable power systems, how that energy is used (e.g. delivered to the institution or sold back to the grid), and other suitable data. Renewable energy services manager 126 also enters into financing arrangements with financial institution 128 and enters into service agreements with service providers such as photovoltaic service system 122, solar hot water service system 114, wind power generator service 116, fuel cell generator service 118, battery power storage service 120 and other suitable service providers, and can electronically communicate data to those entities, such as to arrange for financing payments, to schedule routine or emergency maintenance, or for other suitable purposes. In this manner, renewable energy services manager 126 can charge institutions 102A through 102N for renewable energy services on a monthly basis, such as part of a retail electric power bill, or as a separate charge for electricity, hot water or other energy used by the institution. In another exemplary embodiment, renewable energy services manager 126 can also provide wholesale power from a wholesale power provider 124 in either regulated or unregulated jurisdictions, such that the renewable energy component for the charge is built into the rate paid by institutions 102A through 102N to renewable energy services manager 126 as a reseller from wholesale power provider 124.

System 100 thus facilitates the installation and use of renewable energy sources by allowing the cost of the renewable energy systems to be amortized and to be included as part of the energy cost which is paid for on a monthly basis by institutions 102a through 102n. In this manner, renewable energy resources can be prepaid and financed based on a recurring revenue stream so as to allow financial services institution 128 to advance funds for infrastructure investment and to secure such funds based on an interest in the recurring revenue stream from the power generated or saved by the renewable energy resources.

Figure 2:
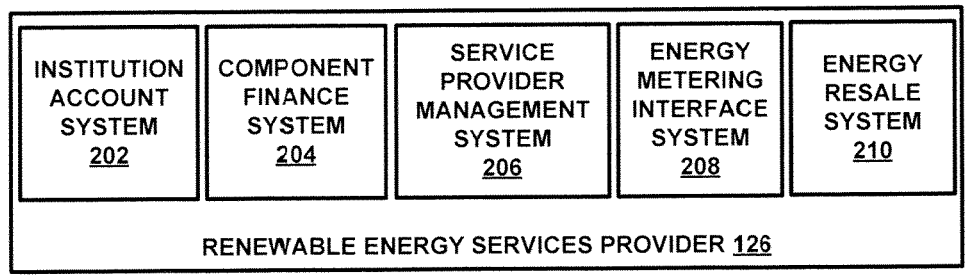
FIG. 2 is a diagram of a system for a renewable energy services provider in accordance with an exemplary embodiment of the present invention.

FIG. 2 is a diagram of a system 200 for a renewable energy services provider in accordance with an exemplary embodiment of the present invention. System 200 includes renewable energy services manager 126 and institution account system 202, component finance system 204, service provider management system 206, energy metering interface system 208 and energy resale system 210, each of which can be implemented in hardware or a suitable combination of hardware and software, and which can be one or more software systems operating on a general purpose processor or server platform.

Institution account system 202 is used to electronically track institutional usage of renewable energy and other energy sources, such as by using electronic metering, an electronic database with indirect usage or loading metrics, or in other suitable manners. In one exemplary embodiment, institution account system 202 can be used to assess charges to an institution based on a pre-arranged or pre-agreed amount of energy capacity that will be provided to that institution. In this exemplary embodiment, an institution such as institution 102A can have a photovoltaic generation and metering system 104 installed on the premises of the institution, which can generate a pre-determined maximum amount of electric energy at a historical solar insolation. The electrical power generated by photovoltaic generation and metering system 104 can be metered and the metered amount of energy provided can be charged to institution account system 202, a flat fee can be used based on the historical solar insolation levels, or other suitable processes can also or alternatively be used. Likewise, similar processes can be used to meter or estimate the energy savings from renewable energy system, such as solar hot water heaters, cogeneration facilities, wind power generators, fuel cells or other suitable renewable energy resources.

Component finance system 204 provides for electronic coordination of financing services for installation of renewable energy infrastructure components and also for payment of finance charges on the renewable energy infrastructure components. In one exemplary embodiment, financing can be associated with the amount of renewable energy that will be generated and the charges assessed for the renewable energy. In another exemplary embodiment, if institution 102A has solar photovoltaic generation and metering system 104 installed on its premises and receives a metered amount of energy that is electronically reported to institution account system 202, component finance system 204 can receive an allocation of the amounts billed to institution 102A for such energy, as opposed to traditional business models for solar photovoltaic generation and metering systems 104 where the institution receives payment for excess energy that is delivered to the distribution grid, but does not have to pay for energy consumed by the institution. Because institutions such as cities, municipalities, college campuses, large business entities and other such institutions have historical energy usage and cost records, these historical records can be used (in conjunction with credit rating data for the institution) by component finance system 204 to generate financing package data for review by financial institutions. Component finance system 204 can also provide electronic management of bidding and financial agreement management.

Service provider management system 206 is used to electronically coordinate maintenance of renewable energy systems. In one exemplary embodiment, service provider management system 206 can be used to electronically monitor renewable energy systems, such as by using telemetry for critical system performance indicators, and can electronically schedule service calls to fix impaired or broken renewable energy systems. Service provider management system 206 can also be used to generate electronic notifications for scheduled maintenance, can upgrade renewable energy systems when more efficient components are available, or can provide other suitable services.

Energy metering interface system 208 receives metering data from distributed renewable energy system components and allocates charges for the metered data. In one exemplary embodiment, charges can be assessed based on usage (such as per kilowatt-hour), on availability (such as for access to solar hot water heater systems or cogeneration hot water systems), or in other suitable manners. Additional data can also be received, such as electrical or gas meter data for a solar hot water system that has a supplemental power source, so as to allow the energy charge for the solar hot water system to be offset by an amount equal to the charges for electricity or gas, such as when solar heating is unavailable. Energy metering interface system 208 coordinates with institution account system 202 to provide a unified billing statement for the distributed renewable energy system components used by an institution.

Energy resale system 210 allows energy, such as electricity or hot water, to be resold to an electrical distribution system retailer or wholesaler, to third parties, or to other suitable entities. In one exemplary embodiment, sales of energy can be brokered or swapped between institutions serviced by renewable energy services manager 126, or renewable energy services manager 126 can negotiate contracts for selling excess energy to wholesale power provider 124 at a better rate than would be realized if individual institutions sold excess energy from separate renewable energy system components.

In operation, system 200 provides for management of renewable energy systems, allocation of renewable energy charges on a monthly basis, financing of renewable energy systems and services, and coordination of repair and replacement services for renewable energy systems. System 200 thus facilitates the use of renewable energy by including renewable energy costs and to recurring monthly charges for energy services that are existing and which can be forecast in a pre-determined manner.

Figure 3:
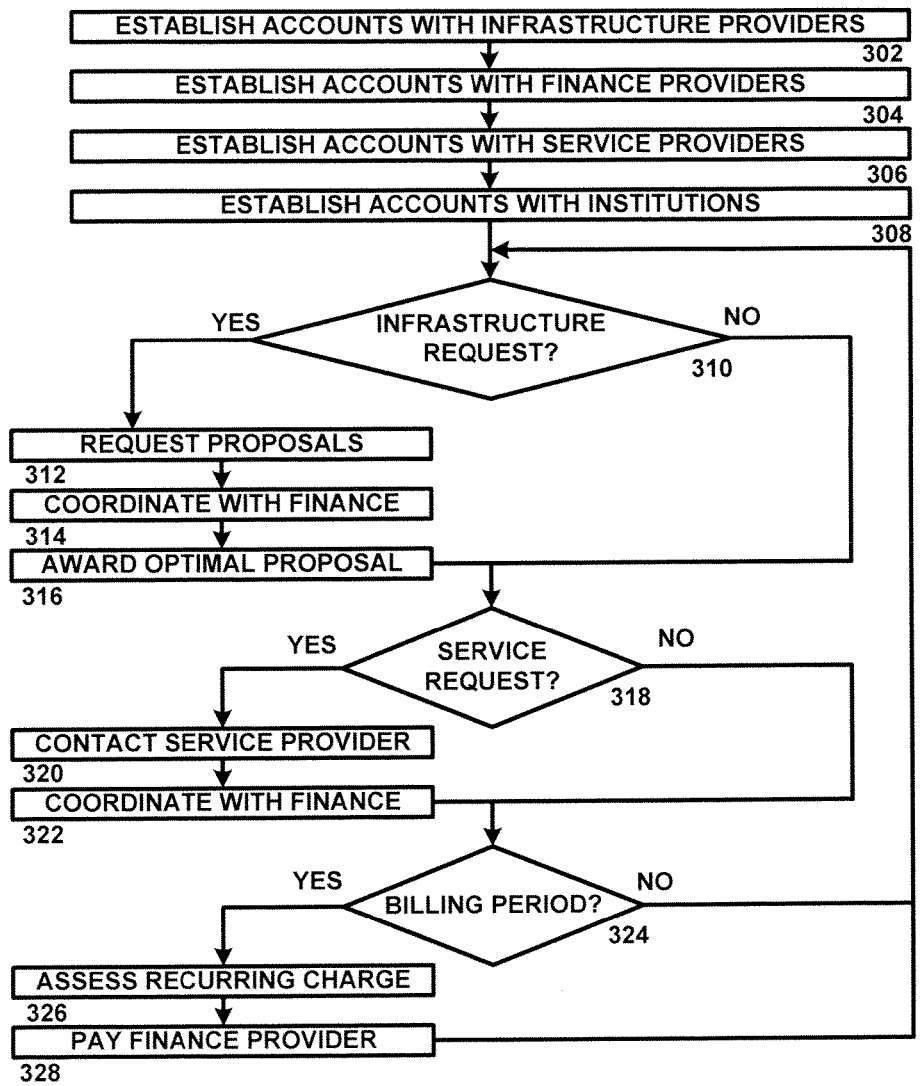
FIG. 3 is a diagram of an algorithm for managing renewable energy infrastructure finance, service and billing in accordance with an exemplary embodiment of the present invention.

FIG. 3 is a diagram of an algorithm 300 for managing renewable energy infrastructure finance, service and billing in accordance with an exemplary embodiment of the present invention. Algorithm 300 can be implemented in software operating on a general purpose processing or server platform so as to convert the general purpose platform into a special purpose machine, or in other suitable embodiments.

Algorithm 300 begins at 302, where electronic accounts are established with infrastructure providers. In one exemplary embodiment, solar photovoltaic system providers, solar hot water system providers, wind power providers, fuel cell generator providers, battery storage providers or other suitable providers can be used to install renewable power resources. In this exemplary embodiment, the renewable power resources can be placed in a stand-alone facility, can be coordinated with existing structures, or can otherwise be structured to be coordinated with an existing facility, such as a co-generation facility. Because renewable energy systems vary in size and application from very small systems (such as systems that are used to provide power to remote signage or traffic lights and residential hot water systems) to larger systems (such as solar photovoltaic systems, wind generator systems and fuel cell generator systems), infrastructure providers can provide project price lists for various types of projects and the associated parameters for installation. In this exemplary embodiment, a solar hot water system would need to be installed at the facility where hot water is to be used, whereas a solar photovoltaic system or wind power generation system can be installed at a remote location, such as where the institution is a city or municipality that has remote and undeveloped land assets. The data generated at 302 can thus also be used to match facilities with available renewable energy sources. The algorithm then proceeds to 304.

At 304, electronic accounts are established with finance providers. In one exemplary embodiment, a finance provider can be a bank or other institution that is willing to extend credit for an infrastructure provider based on the location of the infrastructure, the availability of accounts with institutions to purchase the energy generated by the infrastructure, the types of institutions that are purchasing the energy generated by the infrastructure (such as based on institution credit ratings), or other suitable data. The account data established at 304 can be used to select financial institutions for bidding on infrastructure projects, financial institutions to be approached for funding when bidding is not feasible, or other suitable purposes or processes. The algorithm then proceeds to 306.

At 306, electronic accounts are established with service providers to service the renewable energy infrastructure components. In one exemplary embodiment, the service providers may also be the institutions that have been identified to install the renewable energy service infrastructure components. In another exemplary embodiment, the service providers can be service providers that implement improvements to such systems, that are focused on services to renewable energy systems, or other suitable services providers. The electronic accounts can specify routine maintenance fee schedules, bulk rate fee schedules or other suitable data that can be used in conjunction with equipment failure rate data estimate the amount of funds that will be required over time to maintain and service the renewable energy infrastructure components. The algorithm then proceeds to 308.

At 308, electronic accounts are established with institutions for the purchase of energy from renewable energy infrastructure components, for the installation of renewable energy infrastructure components, and for other suitable purposes. In one exemplary embodiment, an institution such as a city, a municipality, a factory, an individual residence, or other suitable institutions can be approached and offered a renewable energy option to pay for renewable energy as an additional line item on a monthly bill (e.g. $0.01 per kilowatt-hour, as a flat fee, or in other suitable manners), to receive the energy generated by the renewable energy services for a predetermined rate per unit of usage (e.g. $0.10 per kilowatt-hour), or in other suitable manners. In this exemplary embodiment, the institutions can be billed for renewable energy that they consume, can be billed a flat fee for access to the renewable energy infrastructure component, can receive credits for renewable energy sold back to the grid, or other suitable provisions can be made to manage the institution's renewable energy services accounts. The algorithm then proceeds to 310.

At 310, it is electronically determined whether a renewable energy infrastructure project request has been received, such as by monitoring data fields that are used to post renewable energy infrastructure project requests, or other suitable processes can be used. In one exemplary embodiment, data can be entered into a user interface requesting the addition of renewable energy infrastructure at a location, a renewable energy infrastructure project can be coordinated or ordered using a database of available locations and tax or financing incentives, or other suitable processes can be used to generate infrastructure requests. If it is determined at 310 that an infrastructure request has not been received, the algorithm proceeds to 318. Otherwise, the algorithm proceeds to 312 where proposals are requested. In one exemplary embodiment, a plurality of renewable energy infrastructure providers can be identified and proposals can be electronically generated for the specific type of renewable energy infrastructure component being requested. Other suitable proposal processes can also be alternatively be implemented. The algorithm then proceeds to 314.

At 314, the renewable energy infrastructure component request is electronically coordinated with one or more financial institutions. In one exemplary embodiment, financing can be provided for payment of the renewable energy infrastructure component based on a pre-approved line of credit, an existing finance agreement, an account with a financial institution to purchase a pre-determined number of renewable energy infrastructure components, or other financing options. Likewise, financing packages can be generated and transmitted to financial institutions for review and approval, or other suitable processes can also or alternatively be used. The algorithm then proceeds to 316.

At 316, an award is made for the optimal proposal. In one exemplary embodiment, the award can be based solely on the overall revenue that can be generated by installing the renewable energy infrastructure component, including the cost of the renewable energy infrastructure component, the cost of financing, the anticipated revenue stream from the institution that the renewable energy infrastructure component is going to be installed at, and other financial considerations. In another exemplary embodiment, the award can be made based on additional factors, such as the availability of a fixed service contract for recurring repairs to the renewable energy infrastructure component, tax incentives, rebates or other suitable factors. Other suitable processes can also be alternatively be used. The algorithm then proceeds to 318.

At 318, it is determined whether a service request has been received, such as a request that has been electronically generated by a monitoring system of the renewable energy infrastructure component, a request entered through a graphic user interface or other suitable request data. If it is determined at 318 that a service request has not been received the algorithm proceeds to 324. Otherwise, the algorithm proceeds to 320 where a service provider is contacted. In one exemplary embodiment, service provider can be electronically contacted by scheduling a service request with the service provider through a service database. Other suitable processes can also or alternatively be used. The algorithm then proceeds to 322.

At 322 the cost for the service is coordinated with the finance provider. In one exemplary embodiment, a financing entity can provide a line of credit for installation and service of renewable energy infrastructure components, and any excess or additional finances required to provide service can be renegotiated with the finance service provider or the institutions. The algorithm then proceeds to 324.

At 324, it is determined whether a billing period has ended. If the billing period has not ended the algorithm returns to 310. Otherwise the algorithm proceeds to 326, where a recurring charge is electronically assessed for energy provided to an institution. In one exemplary embodiment, the recurring charge can be based on energy measurements obtained electronically, such as by using an electricity kilowatt meter or other suitable devices. In another exemplary embodiment, the recurring charge can be based on a flat fee, such as a charge for a solar hot water system that is based on an estimated fuel savings, a charge for a fuel cell generator that does not include incremental fuel costs, a charge for a battery power storage system, or other suitable charges that are based on having a renewable energy resource available regardless of whether the renewable energy source is used, or the extent to which it is used, such as where metering the amount of use would be difficult or impossible. The algorithm then proceeds to 328.

At 328 payment to the finance provider is electronically scheduled. In one exemplary embodiment, an assessed recurring periodic charge to the institution can be allocated to in part to a finance provider to pay for the initial installation of the renewable energy infrastructure components, services to maintain the renewable energy infrastructure components, or other suitable charges. The algorithm then returns to 310.

In operation, algorithm 300 allows renewable energy infrastructure components to be acquired by forming agreements with renewable energy infrastructure providers and installers, with financing institutions, with service providers, and with institutions that will use the energy generated by the renewable energy surface system components. Algorithm 300 allows charges for the renewable energy infrastructure components to be financed and for payments to be made based on energy charges that are assessed as part of a monthly or other periodic billing cycle. In this manner, the costs for renewable energy infrastructure components can be predetermined and allocated based on expected or predicted energy costs and can be included in a rate base as a line item or in other suitable manners.

Figure 4:
FIG. 4 is a diagram of an algorithm for managing renewable energy component metering and billing in accordance with an exemplary embodiment of the present invention.

FIG. 4 is a diagram of an algorithm 400 for managing renewable energy component metering and billing in accordance with an exemplary embodiment of the present invention. Algorithm 400 can be implemented in software operating on a general purpose processing or server platform so as to convert the general purpose platform into a special purpose machine, or in other suitable embodiments.

Algorithm 400 begins at 402, where metering data is received from distributed renewable energy system components and recorded. In one exemplary embodiment, metering for solar photovoltaic systems, solar hot water systems (and associated metering for electrical and gas metering), wind power generation systems, fuel cell systems or other suitable renewable energy component generation systems can be received on a periodic basis and stored, based on the associated facility, the associated institution, or other suitable data. The algorithm then proceeds to 404.

At 404, metering data is received from distributed institutional consumers and is recorded. In one exemplary embodiment, metering can be used to monitor the energy received from renewable energy system components at the institution, from a distribution grid, or from other suitable sources, and can be received on a periodic basis and stored, based on the associated facility, the associated institution, or other suitable data. The algorithm then proceeds to 406.

At 406, meter data is received for transfers of energy between institutions that are serviced by a renewable energy services provider. In one exemplary embodiment, institutions such as cities, municipalities, factories or other institutions may be located so that excess renewable energy from one institution can be advantageously transferred to an adjacent institution instead of being sold back to the distribution grid or other sources. After such meter data is received and recorded, the algorithm proceeds to 408.

At 408, meter data is received and recorded for energy sales to third parties, such as energy sales back to the electric power distribution grid, a wholesale electric power provider, or other suitable third party sales. Such sales may be unregulated, or may be regulated by state entities and priced at regulated levels, as opposed to negotiated or market levels. After such meter data is received and recorded, the algorithm proceeds to 410.

At 410, it is determined whether a periodic bill should be generated. In one exemplary embodiment, each institution, financing entity and service entity may have different billing cycles, such that bills may need to be generated on a daily basis for different entities. If it is determined that a periodic bill should be generated, the algorithm proceeds to 412, otherwise the algorithm returns to 402.

At 412, institutional meter data is electronically tallied as a function of the periodic bill being generated. In one exemplary embodiment, the meter data can be tallied for predetermined institutions, predetermined renewable generation components, or other suitable components. The algorithm then proceeds to 414.

At 414, any amounts owed to financial institutions are electronically determined and distributed. In one exemplary embodiment, financial institutions can receive a periodic amortized payment on funds extended for capital purchases, can receive payments as a percentage of energy charges to institutions, or can receive other suitable payments. The algorithm then proceeds to 416.

At 416, any amounts owed to service entities are electronically determined and distributed. In one exemplary embodiment, service entities can receive a periodic maintenance service payment, can receive payments based on the amounts due for repairs or replacement of components, or can receive other suitable payments. The algorithm then proceeds to 418.

At 418, any institutional bills that are due are electronically generated and distributed. Institutional bills are typically generated on a predetermined date, such as following receipt of the data from a transmission and distribution services provider, but can be adjusted based on contractual agreements with institutions or in other suitable manners. The algorithm then returns to 402.

In operation, algorithm 400 allows distributed renewable energy system components to be monitored to assess charges to power customers and to generate payments to financing institutions and service providers. Algorithm 400 provides for sales from renewable energy components back to the retail or wholesale energy provider, supports inter-institutional transfers, and allows flexibility in payment and invoice scheduling that can be used to facilitate a distributed renewable energy infrastructure.

While certain exemplary embodiments have been described in detail and shown in the accompanying drawings, it is to be understood that such embodiments are merely illustrative of and not restrictive on the broad invention. It will thus be recognized to those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and the spirit of the invention defined by the appended claims.

What is claimed is:
1. A system for managing distributed renewable energy systems comprising:
one or more solar photovoltaic electricity generation systems coupled to an electric power grid and each configured to generate service data and first meter data defining an amount of energy generated by the solar photovoltaic electricity generation system over a period of time;

a first institution coupled to one or more of the solar photovoltaic electricity generation systems through the electric power grid and configured to receive electric power from one or more of the solar photovoltaic electricity generation systems and to generate second meter data defining an amount of electric power received from the electric power grid;

a photovoltaic electricity generation system service provider system configured to receive maintenance and repair service schedule data for the solar photovoltaic electricity generation systems;

a renewable energy services provider system coupled to the solar photovoltaic electricity generation systems, the first institution and the photovoltaic electricity generation system service provider system, the renewable energy services provider system configured to electronically receive the first meter data, the second meter data and the service data, to allocate an amount of energy from the first meter data to the first institution and to generate the maintenance and repair service schedule data as a function of the service data; and a service provider management system for receiving the service data and for selecting one of a plurality of service providers as a function of a type of routine maintenance, a type of repair, and a location of a renewable energy component.

2. A system for managing distributed renewable energy systems comprising:

one or more wind turbine electricity generation systems coupled to an electric power grid and each configured to generate service data and first meter data defining an amount of energy generated by the wind turbine electricity generation system over a period of time;

a first institution coupled to one or more of the wind turbine electricity generation systems through the electric power grid and configured to receive electric power from one or more of the wind turbine electricity generation systems and to generate second meter data defining an amount of electric power received from the electric power grid;

a wind turbine electricity generation system service provider system configured to receive maintenance and repair service schedule data for the wind turbine electricity generation systems;

a renewable energy services provider system coupled to the wind turbine electricity generation systems, the first institution and the wind turbine electricity generation system service provider system, the renewable energy services provider system configured to electronically receive the first meter data, the second meter data and the service data, to allocate an amount of energy from the first meter data to the first institution and to generate the maintenance and repair service schedule data as a function of the service data; and a service provider management system for receiving the service data and for selecting one of a plurality of service providers as a function of a type of routine maintenance, a type of repair, and a location of a renewable energy component.

3. A system for managing distributed renewable energy systems comprising:

one or more non-combustion turbine electricity generation systems coupled to an electric power grid and each configured to generate service data and first meter data defining an amount of energy generated by the non-combustion turbine electricity generation system over a period of time;

a first institution coupled to one or more of the non-combustion turbine electricity generation systems through the electric power grid and configured to receive electric power from one or more of the non-combustion turbine electricity generation systems and to generate second meter data defining an amount of electric power received from the electric power grid;

a non-combustion turbine electricity generation system service provider system configured to receive maintenance and repair service schedule data for the non-combustion turbine electricity generation systems;

a renewable energy services provider system coupled to the non-combustion turbine electricity generation systems, the first institution and the non-combustion turbine electricity generation system service provider system, the renewable energy services provider system configured to electronically receive the first meter data, the second meter data and the service data, to allocate an amount of energy from the first meter data to the first institution and to generate the maintenance and repair service schedule data as a function of the service data; and a service provider management system for receiving the service data and for selecting one of a plurality of service providers as a function of a type of routine maintenance, a type of repair, and a location of a renewable energy component.

* * * * *